United States Patent
Heo (10) Patent No.: US 7,964,510 B2
(45) Date of Patent: Jun. 21, 2011

(54) METHOD FOR FORMING PATTERN OF A SEMICONDUCTOR DEVICE

(75) Inventor: Jung Gun Heo, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 330 days.

(21) Appl. No.: 12/345,378

(22) Filed: Dec. 29, 2008

(65) Prior Publication Data

US 2009/0246961 A1    Oct. 1, 2009

(30) Foreign Application Priority Data

Mar. 28, 2008    (KR) ........................ 10-2008-0029178

(51) Int. Cl.
*H01L 21/302*    (2006.01)
(52) U.S. Cl. ......... 438/706; 438/724; 438/947; 438/950
(58) Field of Classification Search .................. 438/950, 438/947
See application file for complete search history.

(56) References Cited

U.S. PATENT DOCUMENTS

| 5,328,810 | A | * | 7/1994 | Lowrey et al. | 430/313 |
| 6,500,756 | B1 | * | 12/2002 | Bell et al. | 438/639 |
| 7,087,532 | B2 | * | 8/2006 | Dobuzinsky et al. | 438/717 |

FOREIGN PATENT DOCUMENTS

KR    10-2007-0113604    11/2007

OTHER PUBLICATIONS

Kevin A. Pears et al, Carbon etching with a high density plasma etcher, Feb. 22, 2005, Microelectronic Engineering, 81, p. 7-14.*

* cited by examiner

*Primary Examiner* — Binh X Tran
*Assistant Examiner* — David A Cathey, Jr.
(74) *Attorney, Agent, or Firm* — Marshall, Gerstein & Borun LLP (57) ABSTRACT

A method for forming a pattern of a semiconductor device includes: forming a first mask film and a second mask film over an underlying layer; partially etching the first and second mask films using a photoresist mask pattern as an etching mask to form a intermediate mask pattern having a protrusion shape and including first and second mask film layers, over a remaining portion of the first mask film; forming a first spacer at sidewalls of the intermediate mask pattern etching the remaining portion of the first mask film and the first mask film layer of the intermediate mask pattern using the first spacer and the second mask film layer of the intermediate mask pattern as an etching mask to expose the underlying layer and form a mask pattern having first and second mask film layers; forming a second spacer at sidewalls of the mask pattern; and removing the mask pattern to form a symmetrical spacer pattern.

18 Claims, 8 Drawing Sheets

METHOD FOR FORMING PATTERN OF A SEMICONDUCTOR DEVICE

CROSS-REFERENCE TO RELATED APPLICATION

Priority to Korean patent application number 10-2008-0029178, filed on Mar. 28, 2008, the disclosure of which is incorporated herein by reference in its entirety, is claimed.

BACKGROUND OF THE INVENTION

The invention relates to a method for forming a pattern of a semiconductor device.

Due to rapid distribution of information media such as personal portable equipment and a personal computer equipped with a memory device, the development of processes for manufacturing a highly-integrated semiconductor device that has a high storage capacity, improved reliability, and a fast operating speed for accessing data, has been required.

The speed of the semiconductor device is increased as a critical dimension of a pattern, that is, the size of the pattern, is decreased. In order to improve the integration of the semiconductor device, it is important to control the critical dimension of the pattern in application of a photolithography process.

However, it is difficult to form a line and space (L/S) pattern of less than 40 nm by a single exposure process in the photolithography process using an ArF exposer having a common numerical aperture of less than 1.2. Furthermore, it is more difficult to form an L/S pattern of less than 30 nm even when a high index fluid (HIF) material and a hyper-numerical aperture (hyper-NA) exposer are applied together.

In order to solve the problem of the photolithography process, a double patterning technology (DPT) for improving resolution by lowering a K1 factor in a conventional exposer has been developed.

The DPT comprises i) a double exposure etch technology (DEET) and ii) a spacer patterning technology (SPT), which have been used in a semiconductor device producing process.

The DEET can be applied in a process for forming a multi layer pattern, including a brick wall pattern like a landing plug contact (LPC), a gate, and a bit line. The DEET includes forming a first pattern having twice as large a pitch than a pattern pitch, and forming a second pattern having the same pitch as that of the first pattern between the first patterns, thereby obtaining a pattern having a desired resolution. However, the DEET requires more masks and etching steps for forming the first and second patterns, and causes mis-alignment in the mask process for forming the first and second patterns.

The SPT can be applied in a NAND process including a large amount of metal layers and control gates each consisting of a line and space. Since a mask process for forming a pattern is performed once in the SPT, the SPT is a self-alignment technology for preventing mis-alignment of the mask process. However, the SPT requires a patterning process for cutting a spacer pattern portion and a patterning process for forming a pad pattern in a mat edge portion.

FIGS. 1a to 1d are diagrams illustrating a conventional spacer patterning technology.

Figure 1A:
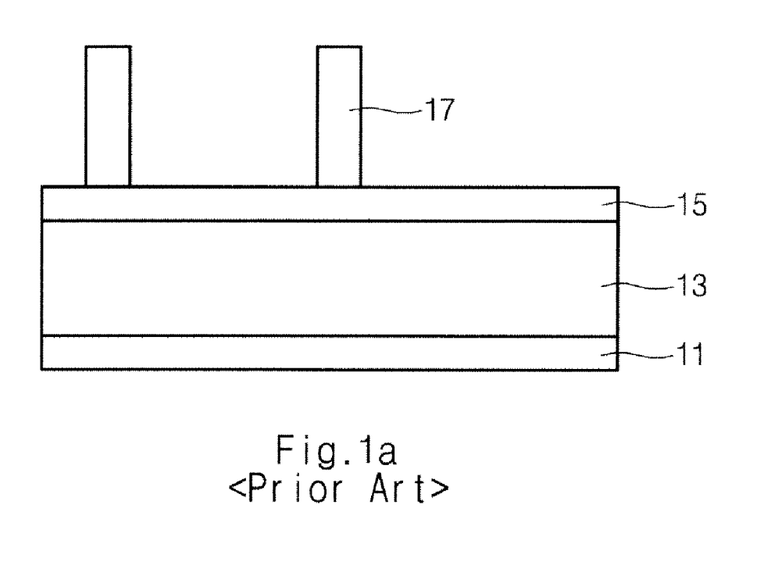
FIGS. 1a to 1d are diagrams illustrating a conventional spacer patterning technology.

Referring to FIG. 1a, a deposition structure including a first mask film 15 and a second mask pattern 17 is formed by a photolithography process over an underlying layer 13 of a substrate 11.

Figure 1B:
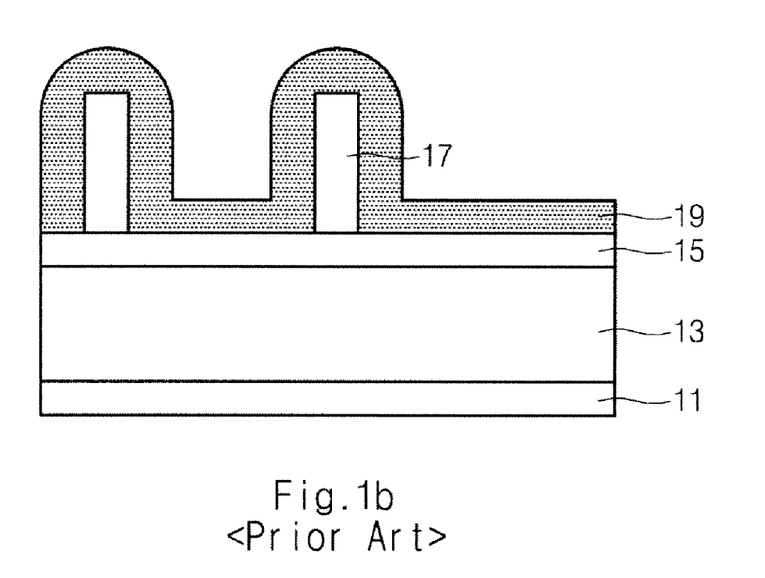

Referring to FIG. 1b, an insulating film 19 is formed over the resulting structure including the second mask pattern 17.

Figure 1C:
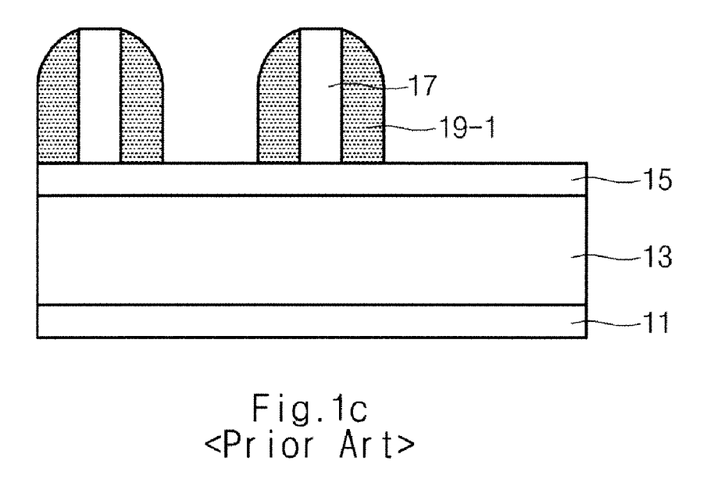

Referring to FIG. 1c, an etch-back process is performed to anisotropically-etch the insulating film 19, thereby forming an isolated spacer 19-1 at sidewalls of the second mask pattern 17.

Figure 1D:
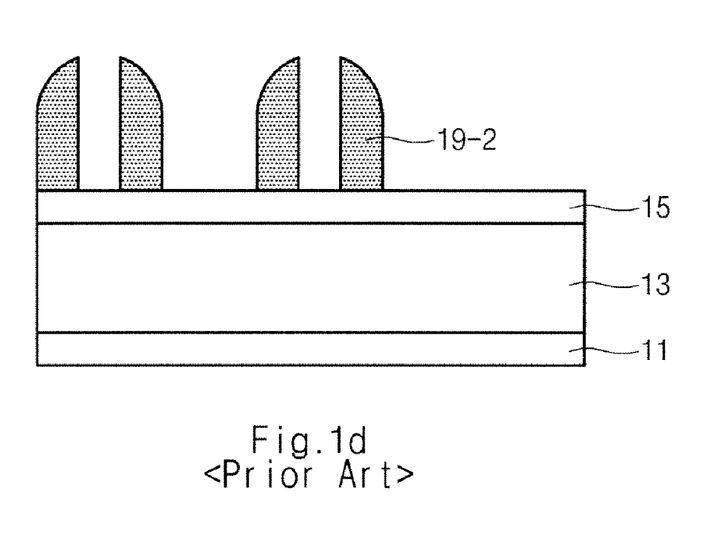

Referring to FIG. 1d, the second mask pattern 17 is removed to form a horn-type spacer pattern 19-2.

Figure 2:
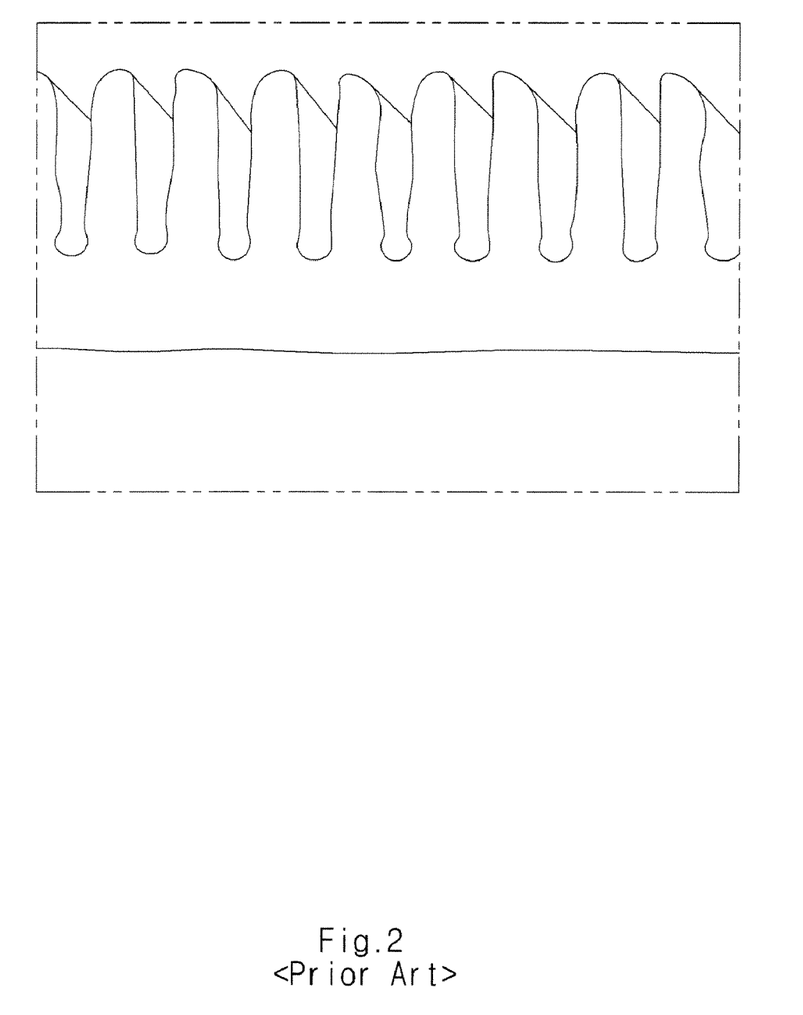
FIG. 2 is an electron micrograph of a lower pattern formed by the conventional spacer patterning technology.

Since the spacer pattern 19-2 has an asymmetrical shape, when the lower underlying layer 13 is etched using the spacer pattern 19-2 as an etching mask a pattern having low critical dimension uniformity is formed, as shown in FIG. 2. As a result, the reliability of the semiconductor device is reduced, and the yield of the semiconductor device is decreased.

BRIEF SUMMARY OF THE INVENTION

Various embodiments of the invention are directed to providing a method for forming a pattern of a semiconductor device which includes forming a symmetrical spacer pattern used as an etching mask pattern in a SPT in order to obtain a stable etching condition.

According to an embodiment of the invention, a method for forming a pattern of a semiconductor device includes: forming a first mask film and a second mask film over an underlying layer; partially etching the first and second mask films using a photoresist mask pattern as an etching mask to form an intermediate mask pattern having a protrusion shape and including first and second mask film layers, over a remaining portion of the first mask film; forming a first spacer at sidewalls of the intermediate mask pattern; etching the remaining portion of the first mask film and the first mask film layer of the intermediate mask pattern using the first spacer and the second mask film layer of the intermediate mask pattern as an etching mask to expose the underlying layer and form a mask pattern having first and second mask film layers; forming a second spacer at sidewalls of the mask pattern; and removing the mask pattern to form a symmetrical spacer pattern.

Before forming a first mask film, the method can further include forming a polysilicon layer, a silicon nitride film, and nitride film over the underlying layer.

Any materials for facilitating deposition at a low temperature and preventing a lifting phenomenon caused by a thermal process can be used as the first mask film. Specifically, the first mask film can include an amorphous carbon layer.

Any materials having a slower etching speed than that of the first mask film in the presence of an etching gas can be used as the second mask film. For example, the second mask film can include a silicon oxide nitride film (SiON) or a silicon oxide film (SiO). The etching speed ratio of the first mask film to the second mask film can be about 5:1 to about 10:1. The etching gas can be selected from the group consisting of oxygen ($O_2$), nitrogen ($N_2$), hydrobromide (HBr), and combinations thereof. The etching gas can be, for example, a hydrofluorocarbon etching gas.

The etching process for forming the intermediate mask pattern having a protrusion shape can be performed using an etching gas selected from the group consisting of oxygen, nitrogen, hydrobromide, and combinations thereof. The height (a) of the first mask film layer of the intermediate mask pattern formed by the etching process can be in a range of about 10% to about 50% of the initial thickness of the first mask film. Specifically, when the initial thickness of the first mask film is about 2000 Å, the height (a) of the first mask film layer of the intermediate mask pattern can be in a range of about 50 Å to about 1000 Å, so as to enable a subsequent etching process.

Since the second mask film has a slower etching speed than that of the first mask film, the second mask film layer of the intermediate mask pattern remains over the first mask film layer of the intermediate mask pattern after the etching process.

The first spacer can be formed by depositing a first insulating film over the intermediate mask pattern and the remaining portion of the first mask film; and performing an anisotropic etching process on the first insulating film.

Any materials having a different etching selectivity than the first mask film and the second mask film can be used as the first insulating film. For example, the first insulating film can include a polysilicon layer and a nitride film. The first insulating film can be deposited to have a conformal shape, and to a thickness, for example, ranging from about 5% to about 50% of the height (a) of the first mask film layer of the intermediate mask pattern.

The etching process for forming a first spacer can be performed using a hydrofluorocarbon gas, such as $CF_4$ and $CHF_3$. The second mask film layer of the intermediate mask pattern has a slower etching speed than that of the first mask film. Specifically, the etching speed ratio of the second mask film layer of the intermediate mask pattern and the first insulating film to the first mask film in the presence of the hydrofluorocarbon gas can be about 1:5 to about 1:10. Accordingly, the second mask film layer of the intermediate mask pattern and the first spacer remain at the top portion and sidewalls of the intermediate mask pattern even after the spacer patterning process.

The etching process for forming the mask pattern can be performed by an isotropic etching process. The etching process can be performed by a trimming etching process using an etching selectivity between the first spacer, the second mask film layer of the intermediate mask film, and the first mask film. That is, the trimming etching process includes overetching the remaining portion of the first mask film using the first spacer and the second mask film layer of the intermediate mask pattern, having a different selectivity, as an etching mask to adjust the critical dimension of the remaining portion of the first mask film.

The isotropic etching process of the mask pattern can be performed using an etching gas selected from the group consisting of oxygen, nitrogen, hydrobromide, and combinations thereof. The etching speed of the first mask film layer of the intermediate mask pattern is faster than that of the first spacer and the second mask film layer of the intermediate mask pattern. As a result, during the trimming etching process, the first mask film layer of the intermediate mask pattern located at the bottom portion is first etched to form the mask pattern whose sidewalls are concave. The first mask film layer of the mask pattern has a critical dimension in a range of about 20% to about 50% of the critical dimension of the first mask film layer of the intermediate mask pattern.

The second-spacer can be formed by depositing a second insulating film over the mask pattern; and performing a dry anisotropic etching process on the second insulating film to expose the underlying layer.

Any materials that are the same as the first insulating film or which have a different etching selectivity than the first mask film can be used as the second insulating film. For example, the second insulating film can include a polysilicon layer and a nitride film. The etching process for forming a second spacer can be performed using a hydrofluorocarbon gas such as $CF_4$ and $CHF_3$. The second insulating film can be deposited to have a conformal shape, and to a thickness ranging from about 5% to about 50% of the height (b) of the first mask film layer of the mask pattern.

The mask pattern is removed, for example, by an etch-back dry method or by a wet strip method, thereby obtaining a symmetrical spacer pattern.

After the symmetrical spacer pattern is formed, the method can further include patterning the underlying layer using the symmetrical spacer pattern as an etching mask. The method can also further include performing a mask process to form a pad pattern in a mat edge portion.

As mentioned above, after a trimming etching process for forming the sidewalls of the mask pattern to be concave is applied, the symmetrical spacer pattern can be formed at sidewalls of the concave mask pattern, thereby facilitating a stable etching process condition in a subsequent etching process. As a result, the uniformity of the pattern critical dimension can be improved, and also the yield of the semiconductor device can be improved.

The subsequent etching process is stably performed with the symmetrical spacer pattern as an etching mask to improve the uniformity of the pattern critical dimension.

DESCRIPTION OF SPECIFIC EMBODIMENTS

FIGS. 3a to 3g are diagrams illustrating a method for forming a pattern of a semiconductor device according to an embodiment of the invention.

Figure 3A:
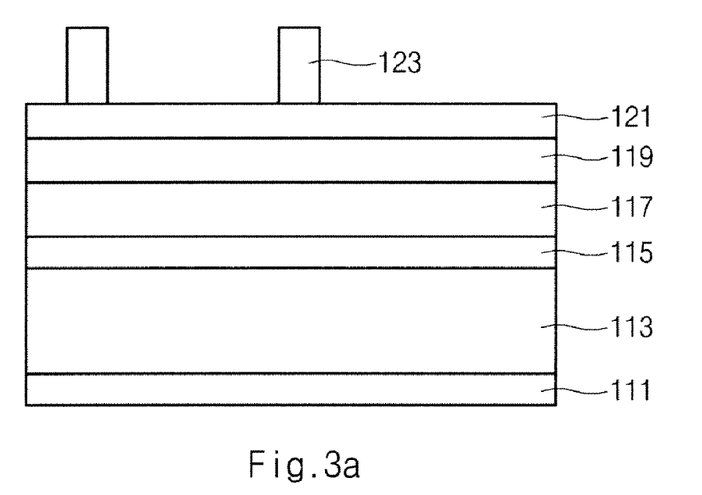
FIGS. 3a to 3g are diagrams illustrating a method for forming a pattern of a semiconductor device including a spacer patterning technology according to an embodiment of the invention.

Referring to FIG. 3a, a deposition structure including a polysilicon layer 115, a first mask film 117, a second mask film 119, and an antireflection film 121 are sequentially formed over an underlying layer 113 of a semiconductor substrate 111. The first mask film 117 can be formed, for example, to a thickness of about 2000 Å using, for example an amorphous carbon layer. The second mask film 119 can include for example a silicon oxide nitride film.

After a photoresist film (not shown) is formed over the antireflection film 121, a photolithography process is performed to form a photoresist pattern 123. The antireflection film 121 is etched with the photoresist pattern 123 to form a photoresist mask pattern (not shown).

The second mask film 119 and the top portion of the first mask film 117 are partially etched using the photoresist mask pattern (not shown) as an etching mask, thereby obtaining an intermediate mask pattern having a protrusion shape formed over the remaining portion of the first mask film 117. The intermediate mask pattern includes a second mask film layer 119-1 and a first mask film layer 117-1.

The partial etching process can be performed, for example, using an etching gas selected from the group consisting of oxygen, nitrogen, hydrobromide and combinations thereof. When exposed to the etching gas, the first mask film 117 is etched about 5 to about 10 times faster than the second mask film 119. After the etching process, the second mask film layer 119-1 remains over the first mask film layer 117-1. The partial etching process can be performed, for example, until the height (a) of the first mask film layer 117-1 is about 10% to about 50% of the initial thickness of the first mask film 117. For example, the first mask film layer 117-1 obtained by the partial etching process can have a height (a) ranging from about 50 Å to about 1000 Å, which can enable a subsequent etching process.

Figure 3B:
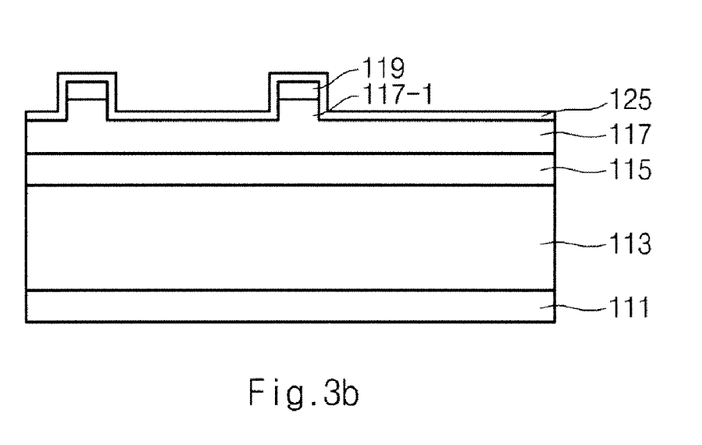

Referring to FIG. 3b, a first insulating film 125 is deposited over the remaining portion of the first mask film 117 and the intermediate mask pattern. The first insulating film 125 can include, for example, a polysilicon layer and a nitride film.

The first insulating film 125 can be deposited, for example, to a thickness ranging from about 5% to about 50% of the height (a) of the first mask film layer 117-1. The first insulating film 125 can be formed to have a conformal shape to that of the remaining portion of the first mask film 117 and the intermediate mask pattern.

Figure 3C:
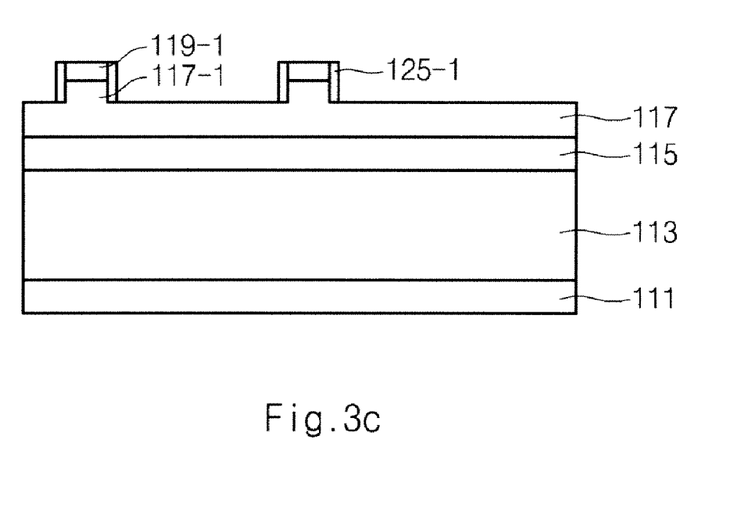

Referring to FIG. 3c, an anisotropic etching process is performed on the first insulating film 125 to expose the remaining portion of the first mask film 117, thereby forming a first spacer 125-1.

The anisotropic etching process can be performed, for example, using a hydrofluorocarbon gas such as $CF_4$ and $CHF_3$ as an etching gas. Since the second mask film layer 119-1 has a slower etching speed than that of the first mask film 117 in the presence of the etching gas, the second mask film layer 119-1 remains over the first mask film layer 117-1 after the spacer patterning process.

Figure 3D:
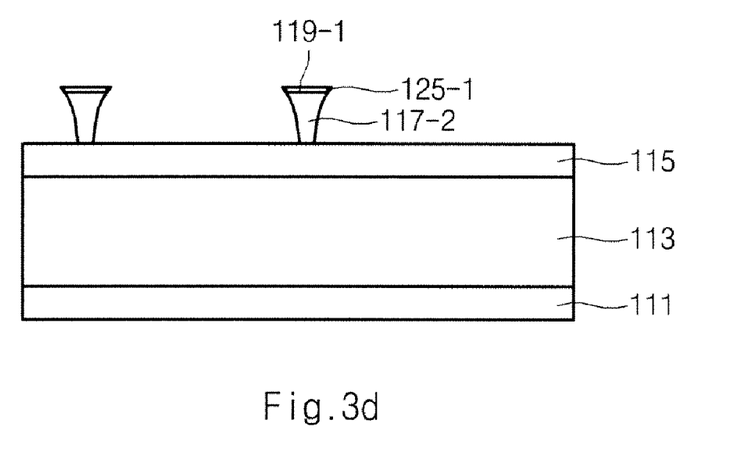

Referring to FIG. 3d, an isotropic etching process is performed on the remaining portion of the first mask film 117 and the first mask film layer 117-1 using the first spacer 125-1 and the second mask film layer 119-1 as an etching mask to expose the polysilicon layer 115, thereby forming a mask pattern having a first mask film layer 117-2. The mask pattern can have, for example, a concave shape.

The isotropic etching process can be performed, for example, by a trimming etching process using an etching selectivity of the first spacer 125-1, the second mask film layer 119-1, and the remaining portion of the first mask film 117. By using an etching gas that etches the first spacer 125-1 and the second mask film layer 119-1 slower than the first mask film 117, the remaining portion of the first mask film 117 is over-etched as compared to the first spacer 125-1 and the second mask film layer 119-1, thereby forming the mask pattern having a first mask film layer 117-2 with a decreased critical dimension as compared to the first mask film layer 117-1 of the intermediate mask pattern.

The isotropic etching process can be performed, for example, using an etching gas selected from the group consisting of oxygen, nitrogen, hydrobromide and combinations thereof. The first mask film layer 117-2 of the mask pattern obtained by the etching process can have a critical dimension ranging from about 20% to about 50% of the critical dimension of the first mask film layer 117-1 of the intermediate mask pattern.

Figure 3E:
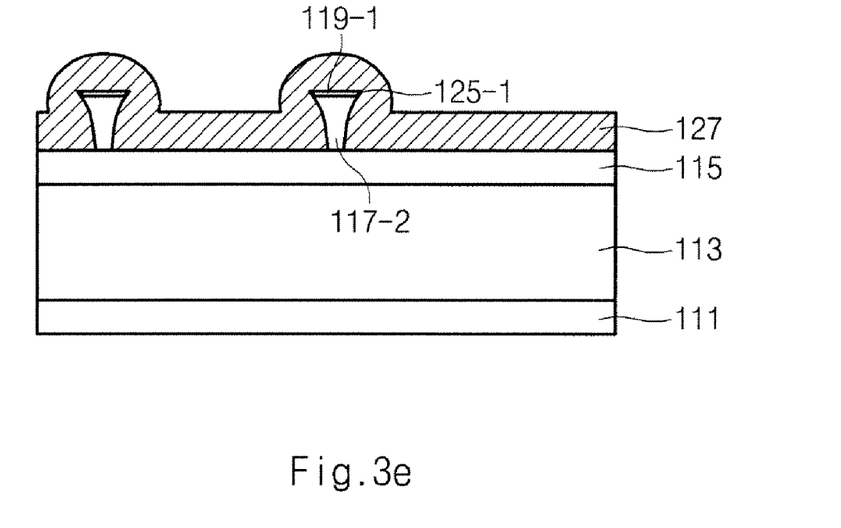

Referring to FIG. 3e, a second insulating film 127 is formed over the mask pattern.

Any materials that are the same material as the first insulating film 125 or which have a different etching selectivity than the second mask film 119 can be used as the second insulating film 127. The second insulating film 127 can include, for example, a polysilicon layer and a nitride film. The second insulating film 127 can be deposited, for example, to a thickness ranging from about 5% to about 50% of the height (b) of the first mask film layer 117-2 of the mask pattern. The second insulating film 127 can also be formed to have a conformal shape to the mask pattern.

Figure 3F:
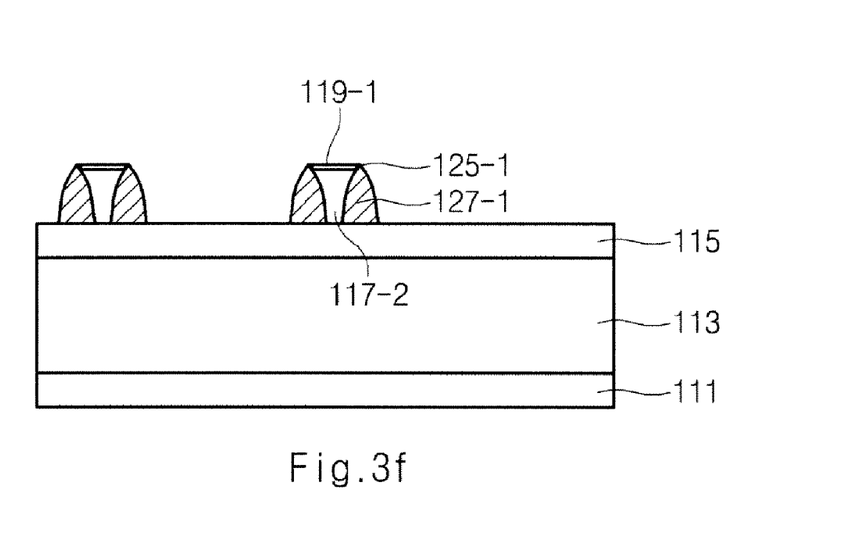

Referring to FIG. 3f, a dry anisotropic etching process can be performed on the second insulating film 127 to form a second spacer 127-1. The dry anisotropic etching process can be performed, for example, using a hydrofluorocarbon gas such as $CF_4$ and $CHF_3$.

Figure 3G:
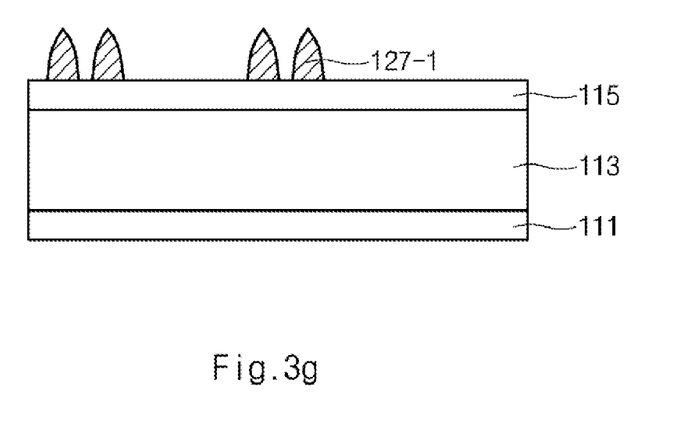
Figure 3H:
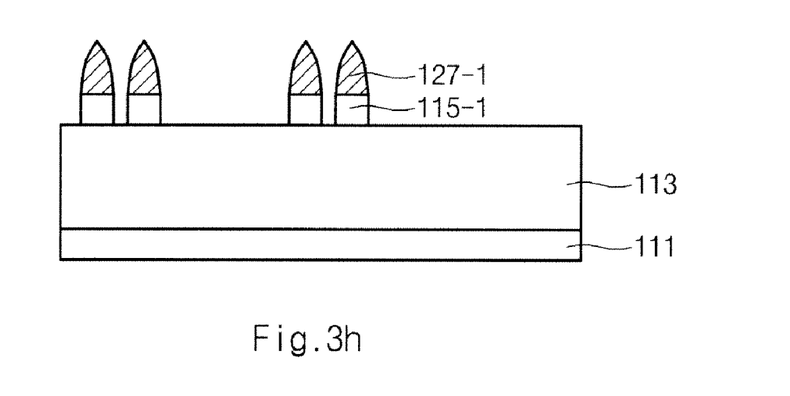

Referring to FIG. 3g, the mask pattern is removed to form a symmetrical spacer pattern 127-2. The mask pattern can be removed, for example, by a dry etch-back etching method or by a wet strip method.

The underlying layer 113 is etched using the symmetrical spacer pattern 127-2 as an etching mask, thereby obtaining an underlying pattern (not shown) having high critical dimension uniformity.

The above embodiments of the disclosure are illustrative and not limitative. Various alternatives and equivalents are possible. The invention is not limited by the type of deposition, etching polishing, and patterning steps describe herein. Nor is the invention limited to any specific type of semiconductor device. For example, the disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a pattern of a semiconductor device, the method comprising:
    forming a first mask film and a second mask film over an underlying layer;
    partially etching the first and second mask films using a photoresist mask pattern as an etching mask to form an intermediate mask pattern having a protrusion shape and comprising first and second mask film layers, over a remaining portion of the first mask film;
    forming a first spacer at sidewalls of the intermediate mask pattern;
    etching the remaining portion of the first mask film and the first mask film layer of the intermediate mask pattern using the first spacer and the second mask film layer of the intermediate mask pattern as an etching mask to expose the underlying layer and form a mask pattern comprising first and second mask film layers;
    forming a second spacer at sidewalls of the mask pattern; and
    removing the mask pattern to form a symmetrical spacer pattern.

2. The method according to claim 1, wherein the first mask film comprises an amorphous carbon layer.

3. The method according to claim 1, wherein the second mask film comprises a material selected from the group consisting of a polysilicon layer, a silicon nitride film, a silicon oxide nitride film, a silicon oxide film, and combinations thereof.

4. The method according to claim 1, wherein the height of the first mask film layer of the intermediate mask pattern is in a range of about 10% to about 50% of an initial thickness of the first mask film.

5. The method according to claim 1, wherein partially etching the first and second mask films is performed with an etching gas selected from the group consisting of oxygen, nitrogen, hydrobromide, and combinations thereof.

6. The method according to claim 5, wherein the etching speed ratio of the first mask film to the second mask film in the presence of the etching gas is in a range of about 5:1 to about 10:1.

7. The method according to claim 1, wherein etching the remaining portion of first mask film and the first mask film layer of the intermediate mask pattern is performed by an isotropic etching process.

8. The method according to claim 7, wherein the isotropic etching process is performed with an etching gas selected from the group consisting of oxygen, nitrogen, hydrobromide, and combinations thereof.

9. The method according to claim 7, wherein the critical dimension of the first mask film layer of the mask pattern after the isotropic etching process is in a range of about 20% to about 50% of the critical dimension of the first mask film layer of the intermediate mask pattern before the isotropic etching process.

10. The method according to claim 1, wherein forming the second spacer comprises:
    depositing a second insulating film over the mask pattern; and
    performing a second anisotropic etching process on the second insulating film to expose the underlying layer.

11. The method according to claim 10, wherein the second film comprises a polysilicon layer and a nitride film.

12. The method according to claim 10, wherein the second film is deposited to a thickness ranging from about 5% to about 50% of the height of the first mask film layer of the mask pattern after an isotropic etching process.

13. The method according to claim 10, wherein the second anisotropic etching process is performed with a hydrofluorocarbon gas.

14. The method according to claim 1, wherein forming the first spacer comprises:
    depositing a first film over the intermediate mask pattern and the remaining portion of the first mask film; and
    performing a first anisotropic etching process on the first insulating film.

15. The method according to claim 14, wherein the first film comprises a polysilicon layer and a nitride film.

16. The method according to claim 14, wherein the first film is deposited to a thickness ranging from about 5% to about 50% of the height of the first mask film layer of the intermediate mask pattern.

17. The method according to claim 14, wherein the first anisotropic etching process is performed with a hydrofluorocarbon gas.

18. The method according to claim 17, wherein the etching speed ratio of the first mask film to the second mask film and the first film in the presence of the hydrofluorocarbon gas is in a range of about 5:1 to about 10:1.

* * * * *